United States Patent
Emma et al.

(10) Patent No.: US 6,285,050 B1
(45) Date of Patent: *Sep. 4, 2001

(54) DECOUPLING CAPACITOR STRUCTURE DISTRIBUTED ABOVE AN INTEGRATED CIRCUIT AND METHOD FOR MAKING SAME

(75) Inventors: Philip George Emma, Danbury, CT (US); Wei Hwang, Armonk; Stephen McConnell Gates, Ossining, both of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/998,084

(22) Filed: Dec. 24, 1997

(51) Int. Cl.[7] .......................... H01L 27/108; H01L 29/76; H01L 29/94; H01L 31/119
(52) U.S. Cl. .......................... 257/296; 257/310; 257/532; 257/533; 257/534; 257/535; 438/393; 438/394; 438/395; 438/396
(58) Field of Search ..................................... 257/532, 534, 257/533, 535, 296, 310; 438/393, 396, 394, 395

(56) References Cited

U.S. PATENT DOCUMENTS

| | | |
|---|---|---|
| 4,455,568 * | 6/1984 | Shiota ................................. 357/54 |
| 5,032,892 | 7/1991 | Chern et al. ......................... 357/51 |
| 5,079,609 * | 1/1992 | Takagi ............................. 357/23.14 |
| 5,212,402 * | 5/1993 | Higgins, III ....................... 257/532 |
| 5,266,821 | 11/1993 | Chern et al. ......................... 257/312 |
| 5,366,931 | 11/1994 | Kim ..................................... 437/209 |
| 5,656,834 | 8/1997 | Grzyb et al. ......................... 257/207 |
| 5,668,399 | 9/1997 | Cronin et al. ........................ 257/532 |
| 5,932,905 * | 8/1999 | O'Bryan, Jr. et al. ............... 257/298 |
| 5,940,676 * | 8/1999 | Fazan et al. ............................ 438/3 |
| 5,955,758 * | 9/1999 | Sandhu et al. ....................... 257/306 |
| 5,972,791 * | 10/1999 | Schuele ................................ 438/653 |
| 5,973,908 * | 10/1999 | Saia et al. ............................ 361/311 |
| 6,034,391 * | 3/2000 | Tobita .................................. 257/306 |

FOREIGN PATENT DOCUMENTS

408264710 * 10/1996 (JP) .
409213836 * 8/1997 (JP) .

OTHER PUBLICATIONS

"MOCVD BaSrTio$_3$ for $\geq$1-Gbit DRAMS" Solid State Technology, 07/97, p. 235, S. M. Bilodeau et al.

* cited by examiner

Primary Examiner—William Mintel
(74) Attorney, Agent, or Firm—F. Chau & Associates, LLP

(57) ABSTRACT

The present invention describes the use of large thin film (TF) capacitors having capacitance C made in a separate set of TF layers ABOVE the Si and wiring levels of an integrated circuit (IC). This C is very large. This invention describes a two-level IC architecture in which a metal/insulator/metal (MIM) capacitor structure comprises the upper level, and CMOS logic and memory circuits made in the Si wafer substrate comprise the lower level. The added thin film capacitance serves to stabilize the power supply voltage at a constant level during GHz IC operation.

8 Claims, 5 Drawing Sheets

Reliable Thin Film Decoupling Capacitor

DECOUPLING CAPACITOR STRUCTURE DISTRIBUTED ABOVE AN INTEGRATED CIRCUIT AND METHOD FOR MAKING SAME

FIELD OF THE INVENTION

The invention relates in general to maintenance of a stable power supply voltage on integrated circuits (IC's), including high-frequency microprocessors. In particular, the invention is directed to the addition of highly reliable thin film capacitors made within the wiring levels of the integrated circuit, and connected to the power supply wiring levels. The added thin film capacitors function as decoupling capacitors, and they act to minimize fluctuations in the power supply voltage level.

BACKGROUND OF THE INVENTION

In prior production integrated circuits, such as microprocessors, frequencies have been in the 100–400 megahertz (MHz) range. In general, those processors are densely populated by logic and memory devices, and there is little spare area available for other functions, e.g., decoupling capacitors. Prior art decoupling capacitors are implemented as Metal-Insulator-Semiconductor (MIS) structures integral to the silicon bulk, as described by Grzyb in U.S. Pat. No. 5,656,834. Historically, in the pre-gigahertz regime, MIS capacitors are added to dataflows as an afterthought, using whatever spare area is available after the main logic design is complete, wherever that spare area happens to be.

This haphazard historical approach to decoupling capacitance is sufficient for stabilizing the power supply voltage, Vdd, when the processor frequency is less than a few hundred MHz. In future designs done in the gigahertz (GHz) regime and beyond, more decoupling capacitance will be needed, and the proximity of that capacitance to the devices that are switching is much more important. That is, in the GHz regime, a haphazard approach to capacitance is not acceptable: a relatively high capacitance is required, and it must be present in a proximate and regular way throughout the logic and memory dataflows.

From a power perspective, an ideal IC would use 100% of its area for decoupling capacitance and current distribution, and none of its area for logic or memory. From a logic and memory perspective, an ideal IC would have 100% of its area used for logic and memory, and no area spent on the overhead of capacitors, which serve no function insofar as computation goes. In U.S. Pat. No. 5,366,931, Kim attempts to satisfy this contradiction using a structure in which the entire back side of the chip is used for decoupling capacitance.

SUMMARY OF THE INVENTION

The present invention describes a new approach. Specifically, the present invention is an integrated circuit chip comprising a silicon layer of integrated circuits, the requisite metal layers to provide the required interconnection, and a separate set of thin film (TF) layers above the silicon and metal layers. This is a Metal-Insulator-Metal (MIM) structure. The TF layers are used to implement TF capacitors that can be connected to the aforementioned metal layers in a manner that provides adequate capacitance, C, that is physically close to all logic and memory devices on the chip.

In addition, the present invention is a method of fabricating the aforementioned apparatus.

Note that TF layers can be made using materials that have large dielectric constants, hence C can be very large—much larger than the capacitance resulting from use of the residual silicon wafer level as was done previously. Also, C can be located mere microns (instead of millimeters) from the active transistors in such an IC, and so C can act as a localized supply of charge to stabilize Vdd. Finally, TF capacitors have no impact on the physical layout of the logic and memory dataflows, i.e., implementing TF decoupling capacitors greatly simplifies the physical layout because it can be done independently (or subsequently).

Decoupling capacitors made on a silicon wafer level have a Metal Insulator Semiconductor (MIS) structure, where the semiconductor is the silicon wafer itself, and the insulator is $SiO_2$, which has a dielectric constant of about 3.9. When made in TF form in accordance with the present invention, C has the Metal Insulator Metal (MIM) structure, and the insulator can be a high dielectric constant thin film dielectric (TFD). The high dielectric constant TFD enables C to be of order 10–100 times larger than the MIS capacitance.

In addition, the insulator can comprise more than one layer made of different materials so as to create a highly reliable structure. In any capacitor, the capacitance is inversely proportional to the thickness of the insulator. Therefore, it is desirable to make the insulator as thin as possible to obtain a large capacitance. However, thin insulators are prone to developing short-circuits with age and use, and therefore are a cause for reliability concerns.

In the current invention, we describe thin insulators comprising a plurality of layers, at least one of which is used for its high dielectric property, and at least one of which is used because of its imperviousness to punch-through (short circuits).

Therefore, it is an object of the present invention to enable high density microprocessors to operate with very stable power supply voltage Vdd at frequencies in the gigahertz regime and greater. Specifically, this is done by using added decoupling capacitance fabricated within the thin film metal wire levels of the IC. This added decoupling capacitance has the Metal Insulator Metal (MIM) structure, and the insulator can be a high dielectric constant thin film dielectric (TFD), which enables very high capacitance per unit area.

Another object of the present invention is to place the MIM capacitors very close to the active circuits, e.g., within 1–10 microns in a preferred embodiment.

It is a further object of one embodiment of this invention to use all of the available Si substrate area for logic and memory elements so that no Si area is used for decoupling capacitors.

It is still another object of this invention to make the thin film decoupling capacitors in a very reliable structure by forming the capacitor dielectric in a plurality of layers (e.g., two or three or more layers), rather than a single layer. Thus, the thin film capacitors of the present invention combine two important features: reliability and a very high capacitance per unit area by means of high dielectric thin film layers.

BRIEF DESCRIPTION OF THE DRAWINGS

The foregoing and other objects, aspects, and advantages will be better understood from the following detailed description of a preferred embodiment of the invention with reference to the drawings, in which:

FIG. 3b shows a cross section of the structure of FIG. 3a.

DETAILED DESCRIPTION OF A PREFERRED EMBODIMENT OF THE INVENTION

Figure 1:
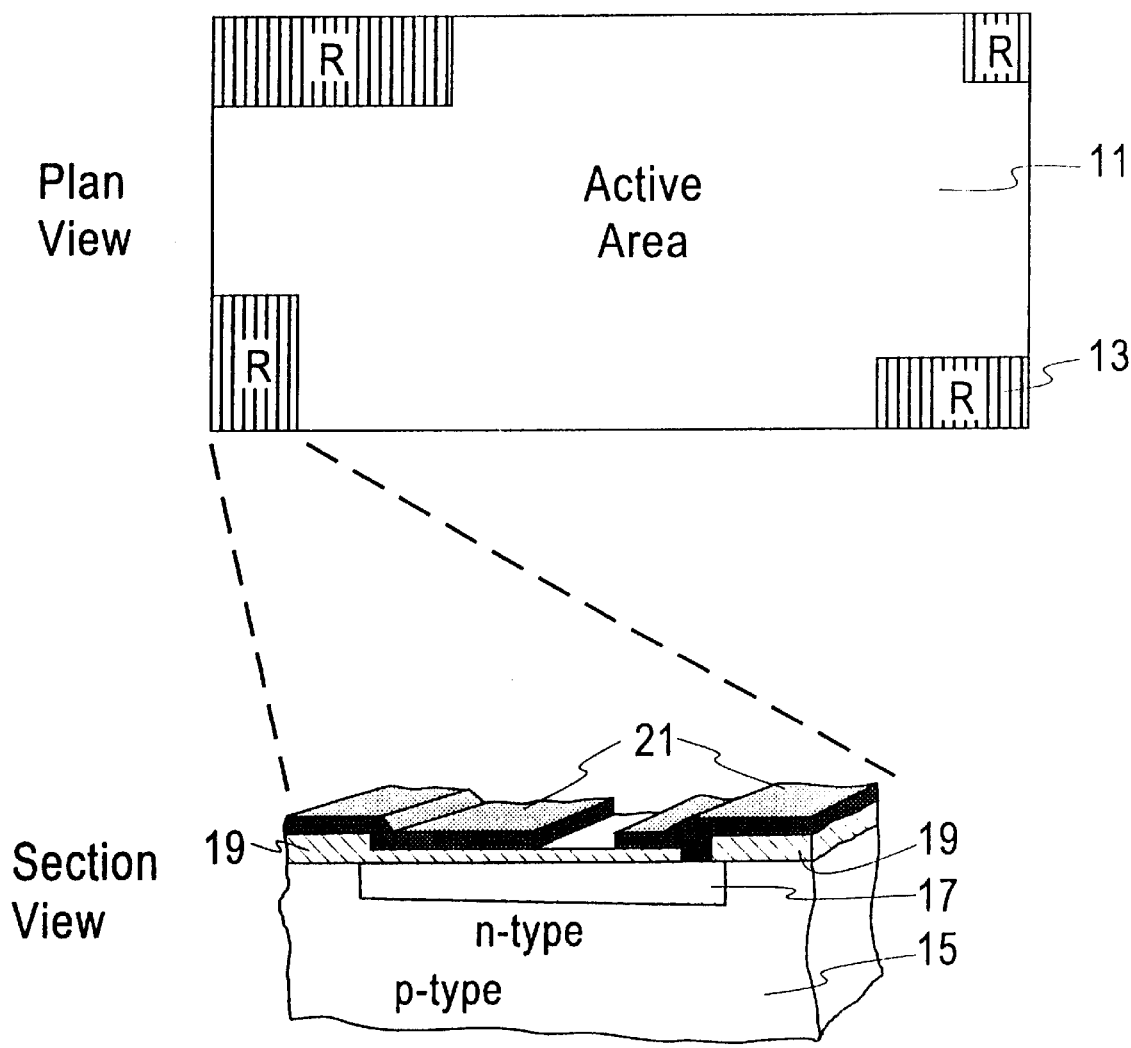
FIG. 1 is a depiction of a prior art structure in which a small residual Si wafer area R, is used to make flat MIS capacitors on a Si wafer substrate.

Referring to FIG. 1 (Prior Art), on prior IC chips, including CMOS processors, it is noted that most of the Si substrate area, 11, is dedicated to active devices. A small residual Si substrate area ("R"), 13, is then available to make flat MIS capacitors on the Si wafer substrate. The section view in FIG. 1 shows a conventional MOS capacitor structure, comprising a Si substrate 15, an n-type contact, 17, which is one electrode of the capacitor. A $SiO_2$ insulator 19 and top electrode 21 (poly-Si or metal) complete the capacitor made at the Si wafer substrate level.

Figure 2:
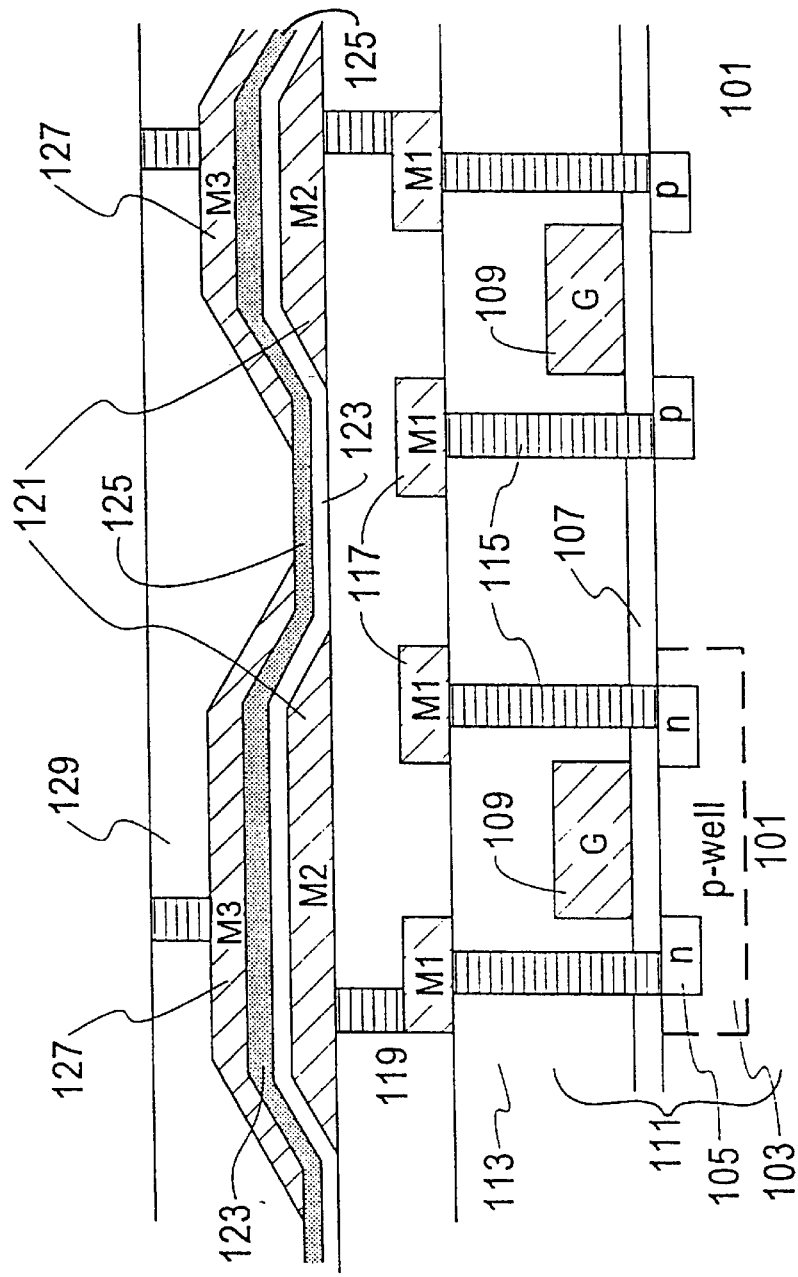
FIG. 2 shows an embodiment of the present invention, integration of reliable thin film capacitors of the present invention using two dielectric layers (bilayer structure) between the M2 and M3 wiring levels of a CMOS IC.

FIG. 2 shows a first embodiment of the present invention: integration of reliable thin film capacitors of the present invention using two dielectric layers (bilayer structure) between M2 and M3 wiring levels of a CMOS IC. Referring to FIG. 2, an n-device and a p-device are shown within the silicon substrate 101 as being representative of a generic integrated circuit. For example, the silicon substrate 101 contains an NMOS transistor 111 defined by the n-type doped source and drain regions 105 implanted into the p-well 103. Also included are a gate dielectric layer 107 and polysilicon gates 109. In the integrated circuit of FIG. 2, contact to the source and drain regions 105 are made by using vias 115 disposed through the dielectric layer 113. A first metal interconnection layer (M1) consists of metal lines 117 and is surrounded by an interlayer dielectric 119. The terminals of both devices are formed by the M1 interconnection layer. The thin-film capacitor is shown as being above the interlayer dialectric 119.

The M2 interconnection level is deposited on the planarized surface of the interlayer dielectric 119. The M2 level is patterned lithographically, and a tapered edge etching process is used to taper the sidewalls of the M2 islands 121. A conformal dielectric is deposited to make the first dielectric layer 123. This first dielectric preferably is an oxide or nitride of Si or Al. For example, the highly conformal "TEOS oxide"made by chemical vapor deposition (CVD) is a preferred first dielectric layer 123. The M2 level forms one electrode of the reliable thin film capacitor. The tapered edges of M2 promote excellent conformal coverage of layer 123, and uniform thickness of layer 123 on all surfaces of metal 121. The tapered edges of M2 render this capacitor structure less susceptible to current leakage, so the capacitor is very reliable.

The second dielectric layer, 125, is then deposited. This layer preferably is an oxide or nitride of a metal such as titanium, tantalum, yttrium, or similar metals. Optionally, said second dielectric may be an oxide of two or three metals such as mixed titanates. Specific examples are barium strontium titanate (BST), strontium titanate (ST), and barium zirconium titanate (BZT). The titanates BST, ST, or BZT are the preferred dielectrics, although other oxides with a high dielectric constant such as lead oxides may be used. These dielectrics may be deposited by CVD, or spinning on a film from a particulate suspension followed by drying and annealing (sol-gel process).

In another embodiment of this invention, the first dielectric layer 123 is not present, and the capacitor is fabricated with only a high dielectric constant layer, 125. This dielectric is then an oxide of a mixture of metals such as mixed titanates, with BST, ST, or BZT being preferred materials, as discussed in the preceding paragraph.

The M3 metal layer 127 is then deposited and patterned, followed by deposition of the interlayer dielectric 129. The M3 level 127 forms the upper electrode of the reliable thin film capacitor. Of the remaining wiring metal levels, only the studs reaching M3 level are shown. The details of subsequent wiring levels (M4 etc.) are specific to each application.

Figure 3A:
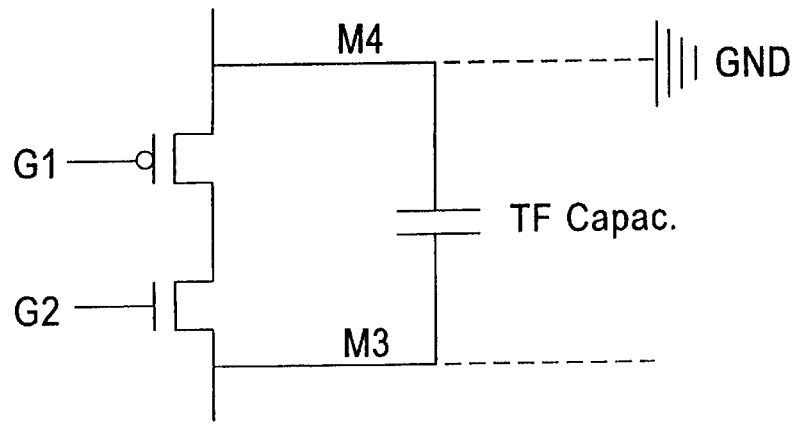
FIG. 3a shows a schematic circuit diagram of another embodiment of the present invention.
Figure 3B:
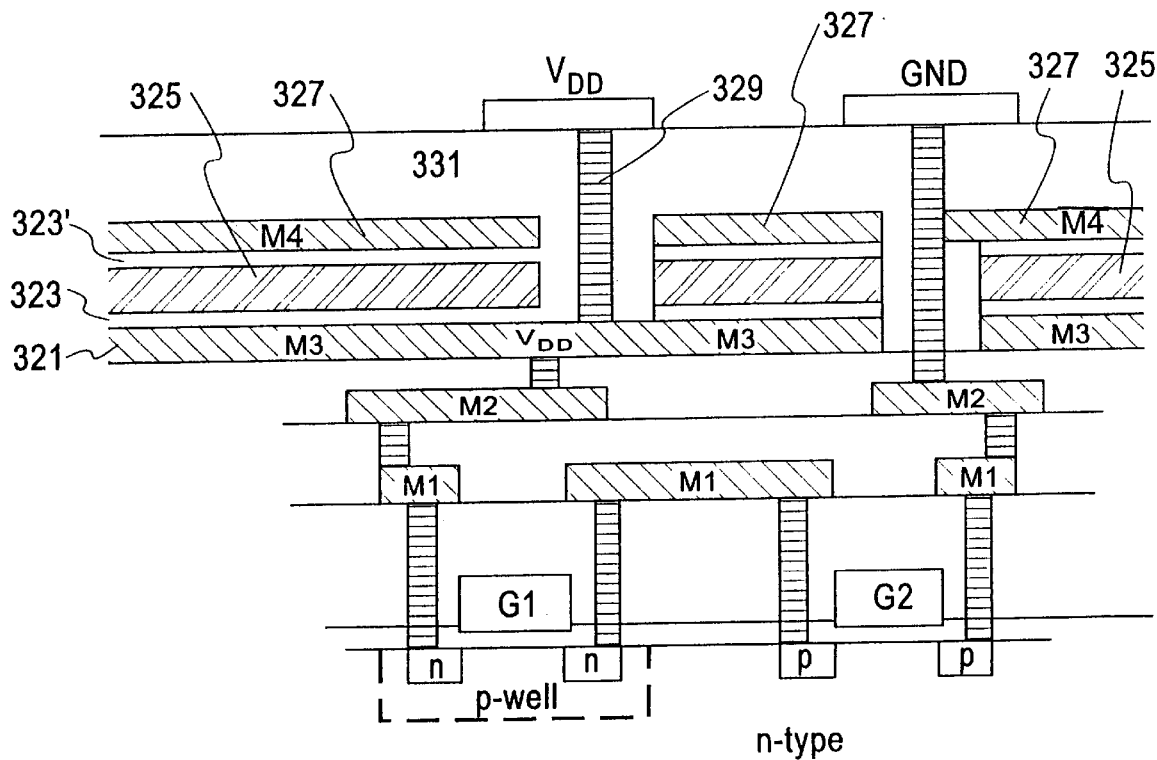

FIG. 3 shows another embodiment of the present invention, integration of reliable thin film capacitors of the present invention using 3 dielectric layers (trilayer structure) between the M3 and M4 (ground) levels of a CMOS circuit. A schematic circuit diagram is shown in FIG. 3a. In FIG. 3a, G1 and G2 are the gate electrodes of two transistors, a PMOS and an NMOS transistor, respectively. M3 is the power supply voltage, Vdd of the circuit. M4 is connected to ground, and the capacitor is connected between these two voltage levels (Vdd and ground). The cross section view is shown in FIG. 3b.

Referring to FIG. 3b, the M3 level 321 is deposited and planarized, the M3 level forming one electrode of the reliable thin film capacitor. A thin layer of interlayer dielectric 323 is deposited. Dielectric 323 comprises an oxide of Si, such as "TEOS oxide" made by chemical vapor deposition, or a nitride of Si, or a mixed oxynitride of Si, or can be an insulating polymer such as polyimide. The layer of high dielectric constant, 325, is then deposited. The high dielectric can be an oxide or nitride of a metal such as titanium, tantalum, or yttrium. Optionally, the dielectric can be an oxide of two or three metals such as mixed titanates. Specific examples are barium strontium titanate (BST), strontium titanate (ST), and barium zirconium titanate (BZT). The titanates BST, ST, or BZT are the preferred dielectrics, although other oxides with a high dielectric constant such as lead oxides may be used. These dielectrics may be deposited by CVD, or spinning on a film from a particulate suspension followed by drying and annealing (sol-gel process).

The interlayer dielectric 323' is then deposited further. The M4 metal level 327 is deposited and planarized, the M4 level forming the top electrode of the reliable thin film capacitor. When the via 329 is completed and filled, the M4 level 327 is connected to ground. The last interlayer dielectric 331 is then deposited and planarized. Of the remaining wiring metal levels, only the power supply Vdd and Ground GND connections are shown. The details of completion of the wiring levels are specific to each application.

In another embodiment of this invention, the first dielectric layer 323 is not present, and the capacitor is fabricated with two dielectric layers. First, the high dielectric constant layer, 325, is deposited. The dielectric may be an oxide or nitride of a metal such as titanium, tantalum, yttrium, or similar metals. Alternatively, an oxide of two or three metals such as the titanates may be used, and again BST, ST, or BZT are preferred materials, as discussed above. Second, a conventional dielectric, 323' is then deposited. The structure is very similar to that of the first embodiment discussed above, but with the order of deposition of the two dielectric layers reversed.

Figure 4A:
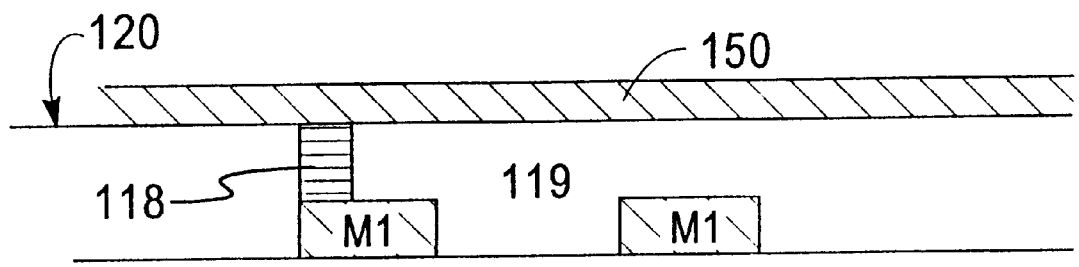
FIGS. 4a–4d illustrate a stepwise process for the fabrication of the thin-film capacitor structure shown in FIG. 2.

A fabrication process for the reliable capacitor structure shown in FIG. 2 is now described with reference to FIGS. 4A, 4B, 4C, and 4D. Referring to FIG. 4A, the interlevel dielectric 119 surrounds the first metal wiring level M1. The top surface of the interlevel dielectric is planarized by a chemical mechanical polishing (CMP) procedure to leave a flat top surface 120. Contact to M1 is made through a via 118, which is etched and filled with metal. The M2 level is fabricated by deposition of a blanket metal film, 150 in FIG. 4A. Preferred metals are the high conductivity metals aluminum, copper, and alloys of aluminum and copper. Optionally, a small concentration of one or more additional elements may be added, for example silicon and the second transition metal series (yttrium, zirconium, niobium).

Previously, Fryer et al. have described different methods to make a tapered edge profile on a metal line or island. These are described in Pages 424–427 of "Conference Record of International Display Research Conference", Monterey, Calif., USA, October 1994, by T. Tsujimura, H. Kitahara, H. Makita, P. Fryer and J. Batey, incorporated herein by reference. A further technique is described in commonly owned U.S. patent application Ser. No. 08/730, 432, filed Oct. 15, 1996, incorporated herein by reference.

The methods of Fryer et al. may be applied to taper the edges of the M2 level when patterning. Alternatively, the following method may be used.

Figure 4B:
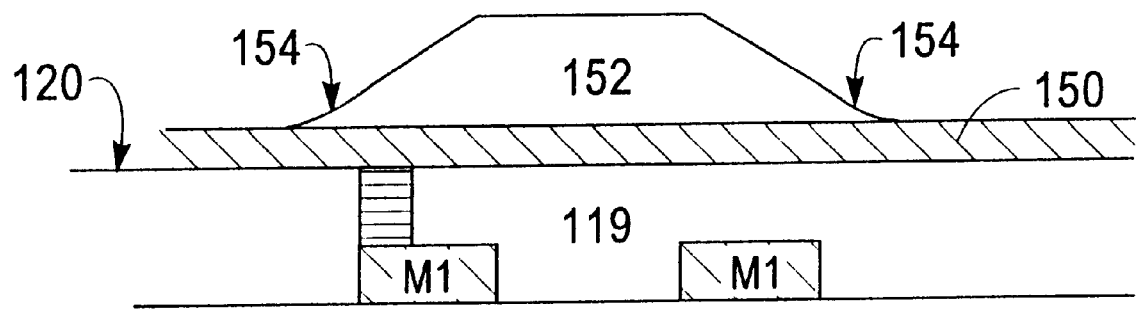

Referring now to FIG. 4B, a photoresist layer 152 is deposited on top of the blanket metal 150, and the photoresist is lithographically patterned. The sidewalls of the photoresist have a tapered profile as shown in FIG. 4B, including thin photoresist regions, 154. Said profile is achieved by suitable selection of the ultraviolet light dose and developing time for the selected photoresist. Optionally, the patterned photoresist may be heated to 50 to 100 degrees C for a suitable time. This heat treatment causes the photoresist to flow out at the edges, producing the desired tapered profile.

The M2 level is then etched using one of two methods: reactive ion etching ("dry etch") or liquid phase using a mixture of acids ("wet etch"). The tapered photoresist profile is transferred to the M2 level in dry or wet etching because etching is impeded during the initial phase of the etch by the thin photoresist 154 located at the edges. Thin photoresist 154 is then removed as the etch progresses, and the metal is etched at the edges. The amount of etching at the edges, and hence the metal edge profile 156, shown in FIG. 4C, is controlled by adjusting the length of etch time, and by the photoresist edge profile 154.

Figure 4C:
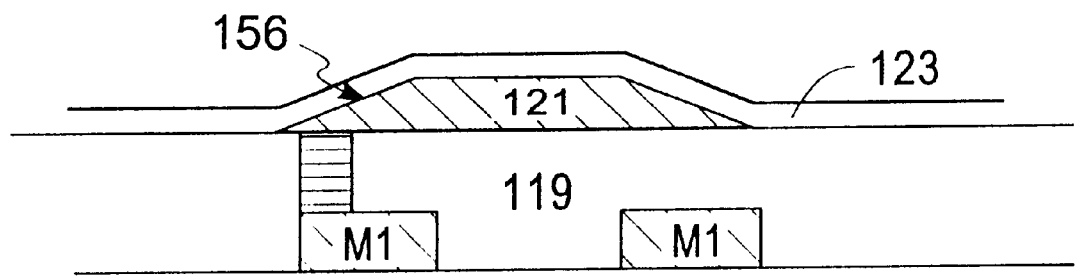

In FIG. 4C, the photoresist has been removed, and the M2 metal level features 121 now have a tapered profile. Alternatively, this profile is produced by the prior art methods listed above. This profile is easily and reliably covered during deposition of the first dielectric layer 123. Dielectric 123 can therefore be thin, resulting in a high capacitance value for the thin film capacitor. (If the metal feature has a square profile, such as the M1 level 117 of FIG. 2, the dielectric must be made thicker to reliably cover the metal feature, and the resulting capacitance is then lower.).

Describing a thin film capacitor with two dielectric layers, $SiO_2$ is a preferred material for the first dielectric 123. This dielectric is preferably deposited using a conformal process and is preferably very inert, such as $SiO_2$. The commonly used $SiO_2$ plasma enhanced chemical vapor deposition process using the precursor tetraethoxy silane ("TEOS") to deposit a "TEOS oxide" is a preferred process for deposition of first dielectric 123.

A second dielectric layer 125 is then deposited on top of layer 123. To achieve a high capacitance, the second dielectric 125 has a high dielectric constant and comprises an oxide or nitride of a metal such as titanium, yttrium, or tantalum. Optionally, dielectric 125 may be an oxide of a mixture of metals such as mixed titanates, specific examples being barium strontium titanate (BST), strontium titanate (ST) and lead zirconium titanate (PZT). These may be deposited by a suitable CVD process, or by spinning on a film from a particulate suspension followed by drying and annealing (sol-gel process).

Figure 4D:
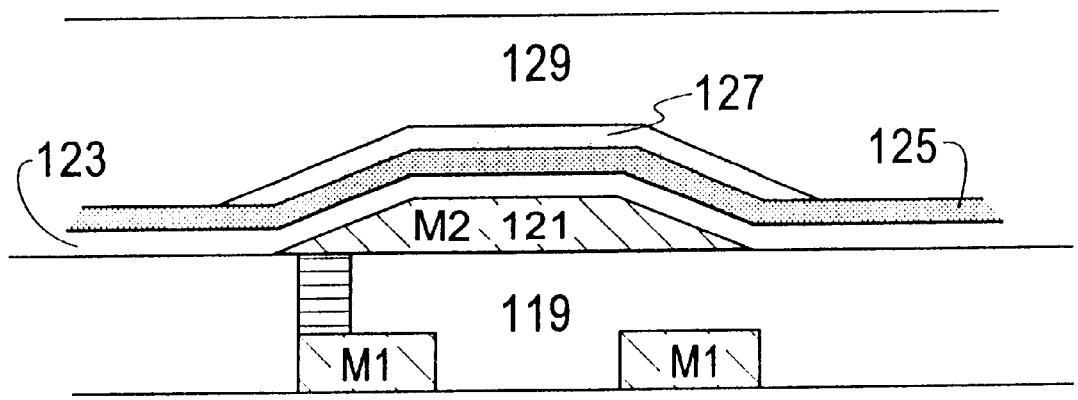

Referring now to FIG. 4D, the M3 metal layer 127 is then deposited and patterned, followed by deposition of the interlayer dielectric 129. The M3 level 127 forms the upper electrode of the reliable thin film capacitor. Contact would be made to layer 127 by etching vias in desired locations (as shown in FIG. 2).

While the invention has been described in particular with respect to preferred embodiments thereof, it will be recognized that modifications to the disclosed embodiments can be effected without departing from the spirit and scope of the invention.

Having thus described our invention, what we claim as new, and desire to secure by Letters Patent is:

1. A metal/insulator/metal (MIM) thin film capacitor structure comprising:

a pair of electrodes formed from a pair of interconnection levels of an integrated circuit chip, said interconnection levels being separate from and above a substrate level of the integrated circuit chip, wherein a lower electrode includes a tapered sidewall profile with surfaces including a top section and two inclined sections; and an insulator disposed between said pair of electrodes, said insulator comprising a plurality of dielectric layers, said dielectric layers and an upper electrode are deposited in parallel with said surfaces of lower electrode.

2. The structure of claim 1 further comprising a separation layer located between said interconnection levels and said substrate level of the integrated circuit chip, said separation layer comprising a dielectric material.

3. The structure of claim 2 wherein said separation layer is formed of an oxide of a metal.

4. The structure of claim 1, wherein at least one of the plurality of dielectric layers is an oxide of a metal.

5. An integrated circuit chip comprising:

a substrate level; and a capacitor level separate from the above the substrate level, the capacitor level comprising a plurality of metal-insulator-metal thin film capacitors, each of which includes a multilayer dielectric disposed between a pair of electrodes, wherein a lower electrode includes a tapered sidewall profile.

6. The integrated circuit chip of claim 5, wherein said multilayer dielectric includes a plurality of dielectric layers, each of which is different from the other one or more dielectric layers.

7. A method for making a metal-insulator-metal thin film capacitor structure in an integrated circuit, comprising:

depositing a blanket metal film on a dielectric material;

depositing a mask layer on the blanket metal film;

removing a portion of the mask layer to expose a portion of the blanket metal layer while leaving a portion of the mask with tapered edges;

etching the exposed blanked metal and mask until a metal level feature remains, the metal level feature having tapered edges with surfaces including a top section and two inclined sections;

depositing a dielectric on the metal level feature; and depositing a metal layer on the dielectric layer, said dielectric and metal layer are deposited in parallel with said surfaces of metal level feature.

8. The structure of claim 1 wherein each of said plurality of dielectric layers is different from the other one or more dielectric layers.

* * * * *